(12) United States Patent
Huang et al.

(10) Patent No.: US 8,420,186 B2
(45) Date of Patent: Apr. 16, 2013

(54) METHOD AND APPARATUS OF GROWING A THIN FILM

(75) Inventors: Jau-Chyn Huang, Hsinchu (TW); Kong-Wei Cheng, Hsinchu (TW); Wen-Sheng Chang, Pingtung (TW); Tai-Chou Lee, Chiayi (TW); Ching-Chen Wu, Taichung (TW)

(73) Assignee: Industrial Technology Research Institute (TW)

( * ) Notice: Subject to any disclaimer, the term of this patent is extended or adjusted under 35 U.S.C. 154(b) by 518 days.

(21) Appl. No.: 11/987,307

(22) Filed: Nov. 29, 2007

(65) Prior Publication Data
US 2008/0152836 A1 Jun. 26, 2008

(30) Foreign Application Priority Data
Dec. 22, 2006 (TW) ................................ 95148509 A (51) Int. Cl.
 *B06B 1/20* (2006.01)
(52) U.S. Cl.
 USPC ........................................................... 427/600
(58) Field of Classification Search ................... 427/600
 See application file for complete search history.

(56) References Cited

U.S. PATENT DOCUMENTS

| | | | |
|---|---|---|---|
| 6,258,698 B1* | 7/2001 | Iwasaki et al. ................. | 438/455 |
| 6,536,240 B1* | 3/2003 | Gouskov et al. ................ | 65/391 |
| 2003/0183154 A1* | 10/2003 | Mizutani et al. ................ | 117/54 |
| 2007/0163644 A1* | 7/2007 | Van Duren et al. ............ | 136/262 |

FOREIGN PATENT DOCUMENTS

| | | |
|---|---|---|
| CN | 1522953 | 8/2004 |
| CN | 1567039 | 1/2005 |
| TW | 334588 | 6/1998 |

OTHER PUBLICATIONS

Choi et al "Properties of Cadmium Sulfide Thin Films Deposited by Chemical Bath Deposition with Ultrasonication" Solar Energy V64, Nos. 1-3, pp. 41-47 (1998).*
Gorska et al. "Spray Pyrolysis of Silver Indium Sulfides" Thin Solid Films, V67 pp. 341-345 (1980).*
Makhova et al "Composition and Properties of ZnS Thin Films Prepared by Chemical Bath Deposition from Acidic and Basic Solutions" Phys. Stat. Sol. (c) 2 No. 3 pp. 1206-1211 (2005).*
Mane et al ("Chemical Deposition Method for Metal Chalcogenide Thin Films" Materials Chemistry and Physics V65 pp. 1-31 (2000).*
G.M. Padam and S.U. M. Rao "Preparation and Characterization of Chemically Deposited CuInS2 Thin Films" Solar Energy Materials 13 (1986) pp. 297-305.*
Kalyani Ghule et al, "Preparation and characterization of ZnO nanoparticles coated paper and its antibacterial activity study," Green Chemistry, The Royal Society of Chemistry 2006, p. 1034-1041.

* cited by examiner

*Primary Examiner* — Nathan Empie
(74) *Attorney, Agent, or Firm* — Bacon & Thomas, PLLC (57) ABSTRACT

A method and apparatus of growing a thin film are provided. The method comprises at least (a) providing a number of substrates; (b) cleaning the substrates; and (c) placing the substrates into a reaction liquid; (d) vibrating the reaction liquid by ultrasonic waves such that a thin film is grown on the substrates evenly.

5 Claims, 7 Drawing Sheets

METHOD AND APPARATUS OF GROWING A THIN FILM

This application claims the benefit of Taiwan application Serial No. 95148509, filed Dec. 22, 2006, the subject matter of which is incorporated herein by reference.

BACKGROUND OF THE INVENTION

1. Field of the Invention

The invention relates in general to a method and apparatus of growing a thin film, and more particularly to a method and apparatus of growing a liquid-deposited thin film.

2. Description of the Related Art

The method of growing a thin film can be divided into two main classes: vapor phase deposition and liquid phase deposition. The vapor phase deposition method has been widely applied to a semiconductor process and photoelectric industry. However, owing that the vapor phase deposition method requires a series of vacuum procedures in an industrial manufacturing process, it costs very much in hardware investment and manufacturing, which affects its competitive advantage in applications. Therefore, it is necessary to develop low-cost thin film deposition technology. The liquid phase deposition thin film growing technology and equipment are taking an essential role due to the features of low manufacturing cost, a larger area of film deposition and less limitation to appearance of deposition carriers.

The conventional liquid phase deposition technology is low-temperature deposition technology, which is operated in a normal pressure and low temperature 30° C.~90° C. without applying an external electric field. The substrate is dipped in a reaction liquid and combination and deposition speed of the reactants can be controlled by adjusting reaction parameters of the reaction liquid to control to deposit a thin film on the surface of the substrate.

Figure 1:
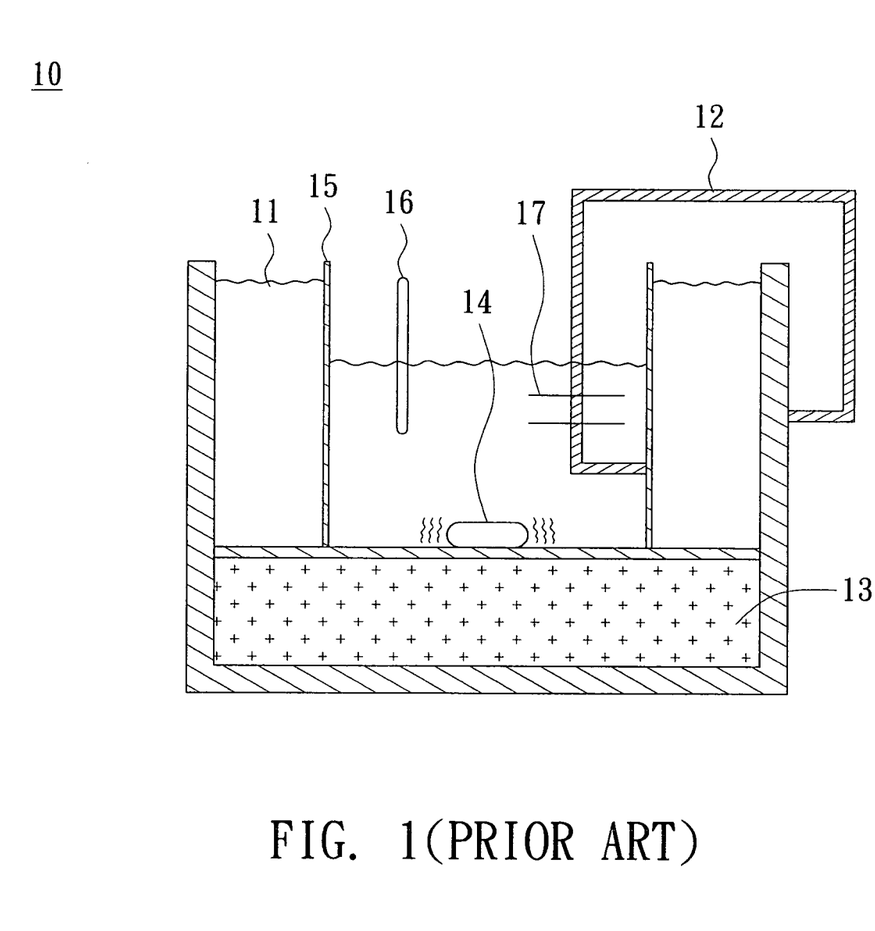
FIG. 1 is a schematic diagram of a conventional thin-film growing apparatus.

Referring to FIG. 1, a schematic diagram of a conventional thin-film growing apparatus is shown. A conventional thin-film growing apparatus 10 carries a constant-temperature sink 11 for controlling temperature of the reaction liquid through a heating stirrer 13. The constant-temperature sink 11 has a reaction-liquid trough 15 and a stirring device 14 is placed in the reaction-liquid trough 15. The stirring device 14 can be moved by the heating stirrer to stirring the reaction liquid in the trough 15 evenly. A pH-value detector 16 is disposed in the reaction-liquid trough 15 for controlling pH-value response of the reaction liquid. A substrate support base 12 is connected to the constant-temperature sink 11 and is inserted in the reaction-liquid trough 15 for supporting a substrate 17 to function in the reaction-liquid trough 15.

The liquid phase deposition thin film technology has two mechanisms on substrate surface deposition: (1) ion-by-ion mechanism in which ions of the reaction liquid grow the thin film directly on the surface of the substrate; (2) cluster-by-cluster mechanism in which ions of the reaction liquid are evenly compounded by cluster and then absorbed onto the surface of the substrate to grow the thin film.

The thin film grown by ion-by-ion mechanism has advantages of being thick, uniform, even and having high adhesion ability. However, another thin film grown through cluster-by-cluster mechanism in the liquid phase deposition thin film technology has uneven thickness and lower adhesion ability. Therefore, when a number of substrates are grown at the same time in the liquid phase deposition technology, the range between the substrates will affect the quality of thin-film quality. Owing that the range of the substrates is related to the composition, the concentration, the temperature, the pH-value of the reaction liquid and the character of the substrate surface, if the equipment for carrying the substrates can only carry the substrates by a constant range, variety and quality of the thin films grown on the substrates will be limited and thus applicability of the thin-film growing method will be reduced.

The thin films grown on the substrate in the conventional liquid phase deposition technology includes a thin film of ion-by-ion mechanism and a thin film of cluster-by-cluster mechanism, which worsens the quality of the thin film grown on the substrate.

Besides, when thin films are deposited on a number of substrates, the range between the substrates has to be adjusted according to composition of the reaction liquid. The issues of substrate-range adjustment and poor quality of thin film deposition both increase difficulty of process quality management, relatively reduce product throughout, and increase production cost.

SUMMARY OF THE INVENTION

The invention is directed to a method and apparatus of growing a thin film. By using ultrasonic vibrator and adjusting a range between the substrates, the concentration, the temperature and the pH-value of the reaction liquid and repeatedly dipping, the thin film can be evenly grown on the substrate with high adhesion ability, which can effectively improve thin-film quality.

According to a first aspect of the present invention, a method of growing a thin film is provided. The method comprises at least (a) providing a plurality of substrates; (b) cleaning the substrates; and (c) placing the substrates into a reaction liquid; (d) vibrating the reaction liquid by ultrasonic waves such that a thin film is grown on the substrates evenly.

According to a second aspect of the present invention, an apparatus of growing a thin film on a plurality of substrates is provided. The apparatus comprises at least a reaction trough and an ultrasonic vibrator. The reaction trough is for containing a reaction liquid, wherein the substrates are placed into the reaction trough such that the reaction liquid grows the thin film on the substrates. The ultrasonic vibrator is for vibrating the reaction liquid by ultrasonic waves.

The invention will become apparent from the following detailed description of the preferred but non-limiting embodiments. The following description is made with reference to the accompanying drawings.

DETAILED DESCRIPTION OF THE INVENTION

The invention provides a method and apparatus of growing a thin film. A reaction liquid is used as a forerunning substance for thin film deposition. By using ultrasonic waves to vibrate the reaction liquid, separate the small cluster-by-cluster particles and help the ion-by-ion particles to grow the thin film, the thin-film quality can be improved. In the following description, the method and apparatus of growing the thin film will be illustrated in details as embodiments. However, the embodiments will not limit the scope of the invention. The invention is not limited to the mode described in the embodiments.

Figure 2A:
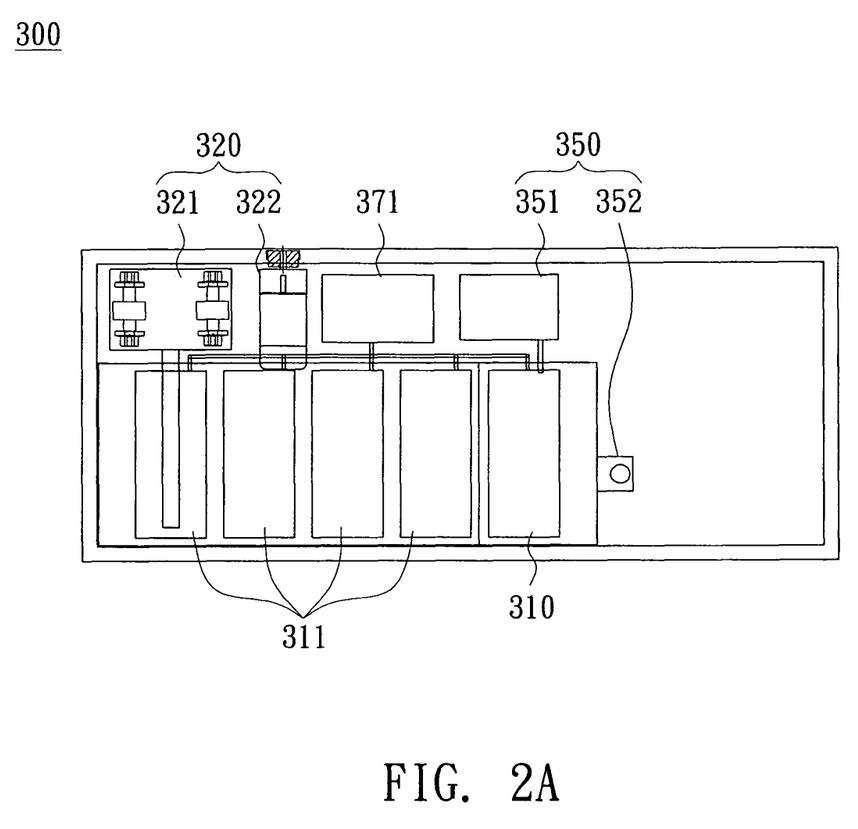
FIG. 2A is a top view of a thin-film growing apparatus according to a preferred embodiment of the invention.
Figure 2B:
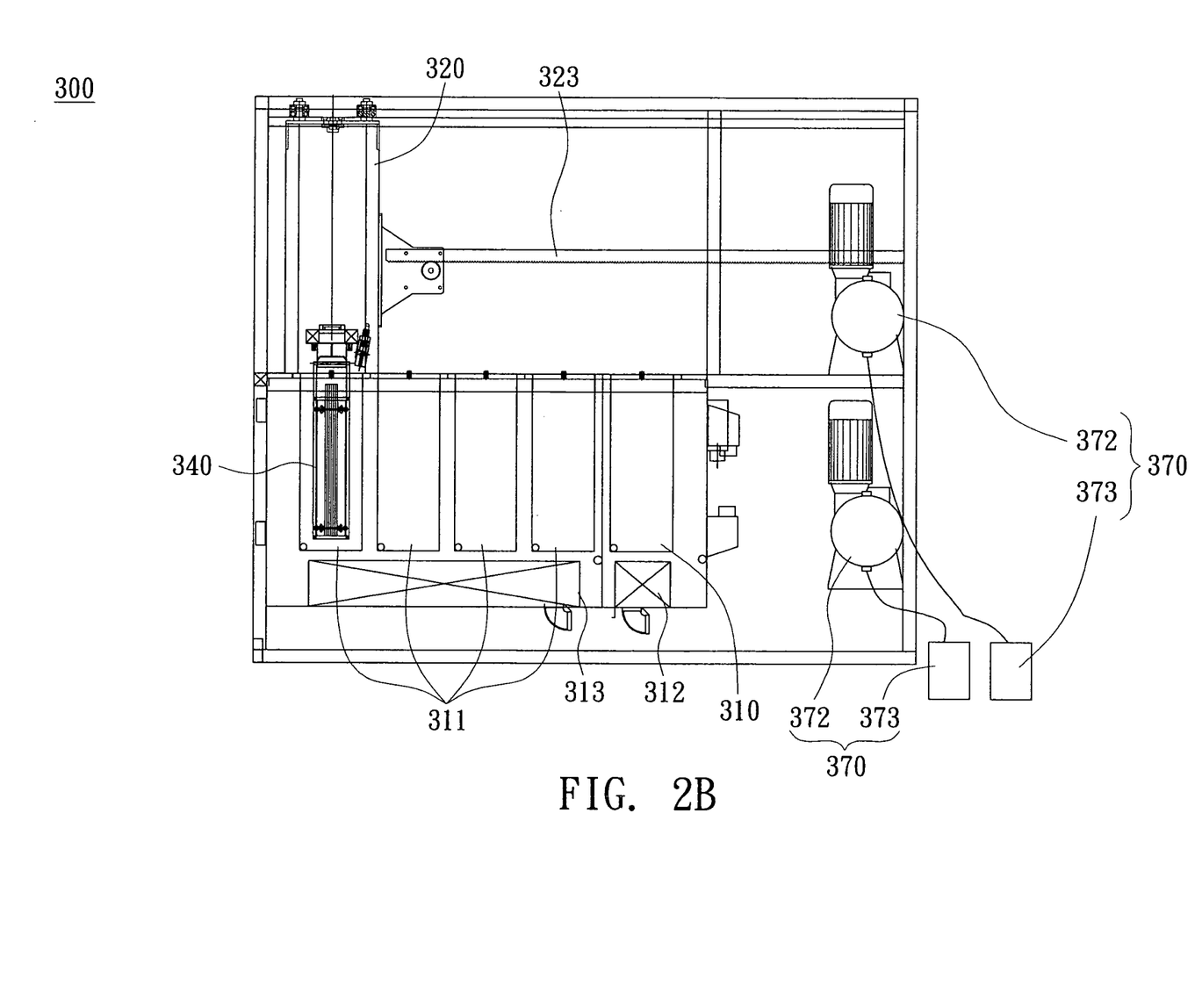
FIG. 2B is a front view of a thin-film growing apparatus according to a preferred embodiment of the invention.
Figure 2C:
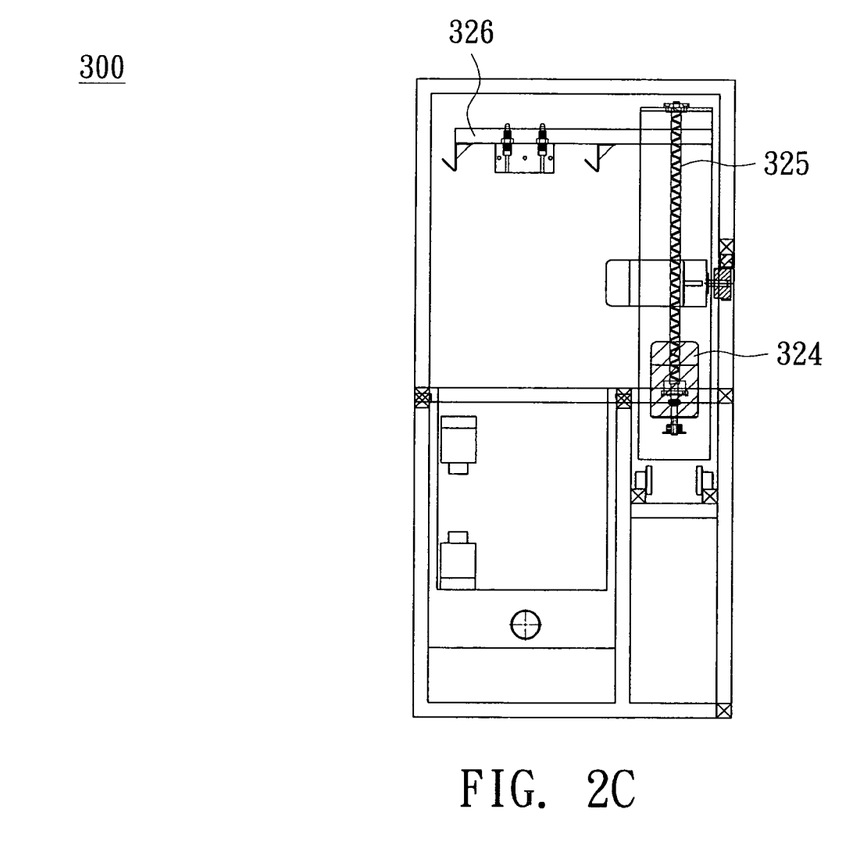
FIG. 2C is a lateral view of a thin-film growing apparatus according to a preferred embodiment of the invention.

Referring to FIGS. 2A-2C, a top view, front view and lateral view of a thin-film growing apparatus according to a preferred embodiment of the invention are shown respectively. A thin-film growing apparatus 300 of the embodiment includes a reaction trough 310, ultrasonic vibrators 312 and 313, a carrying unit 340, a number of cleaning troughs 311, a shifting unit 320 and a liquid input device 370. The reaction trough is for carrying a reaction liquid. The substrates 360 (shown in FIG. 4) are placed into the reaction trough 310. The ultrasonic vibrator 312 is disposed at the lower part of the reaction trough 310. The ultrasonic vibrator 312 is for vibrating the reaction liquid by ultrasonic waves so as to grow a thin film on the substrates 360. The carrying unit is for carrying the substrates 360. The several cleaning troughs 311 are placed in front of the reaction trough 310 for cleaning the substrates 360 by using the ultrasonic vibrator 313 before growing. The shifting unit 320 is disposed at the upper part of the reaction trough 310 and connected to the carrying unit 340 to move the carrying unit 340 in each cleaning trough 311 and the reaction trough 310. The liquid input device 370 is used to input liquid in a constant amount to each cleaning trough 311 and the reaction trough 310. The parameter adjusting unit 350 is used for adjusting the temperature, the concentration and the pH-value of the reaction liquid.

Figure 3:
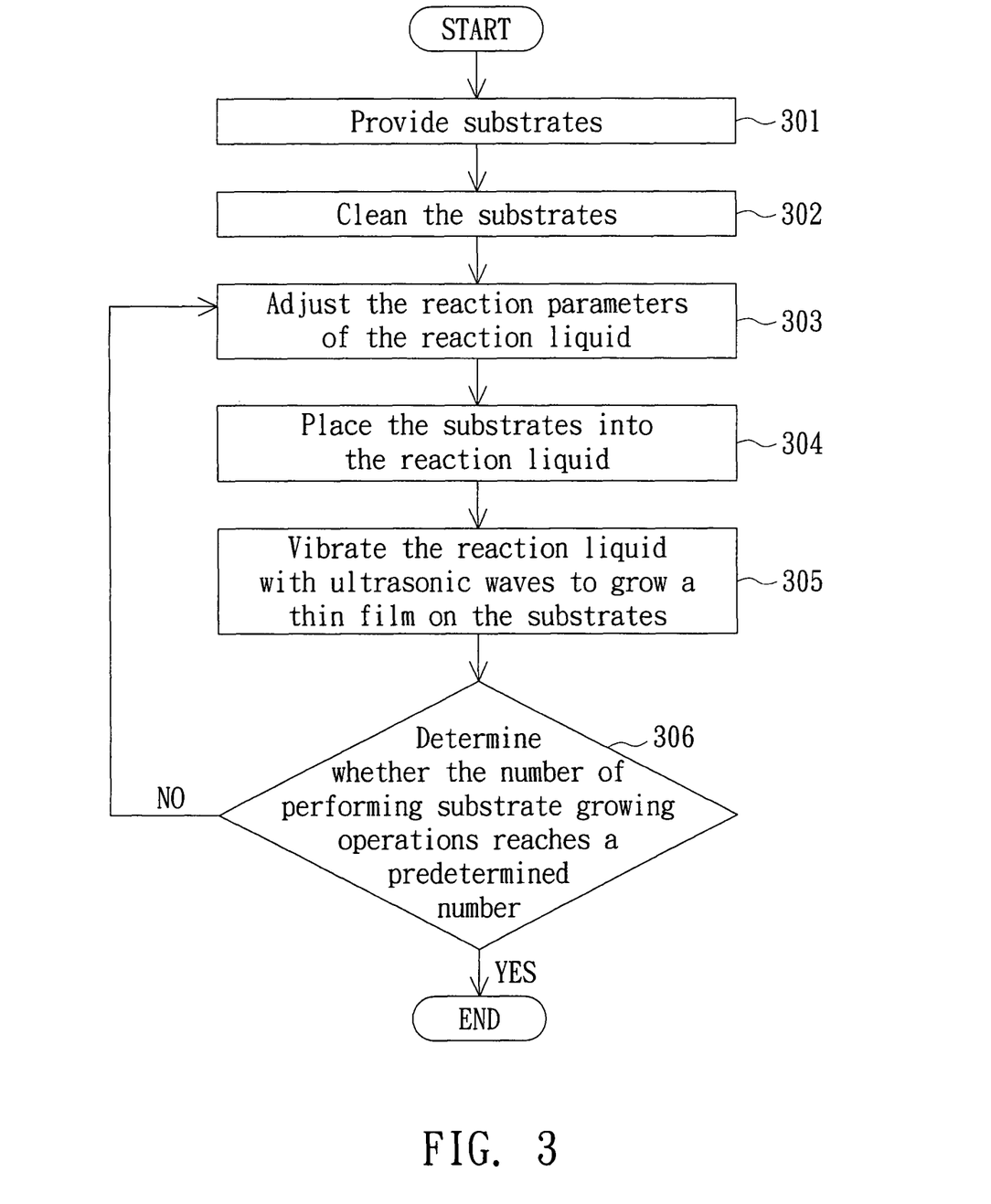
FIG. 3 is a schematic diagram of a thin-film growing method according to the preferred embodiment of the invention.
Figure 4:
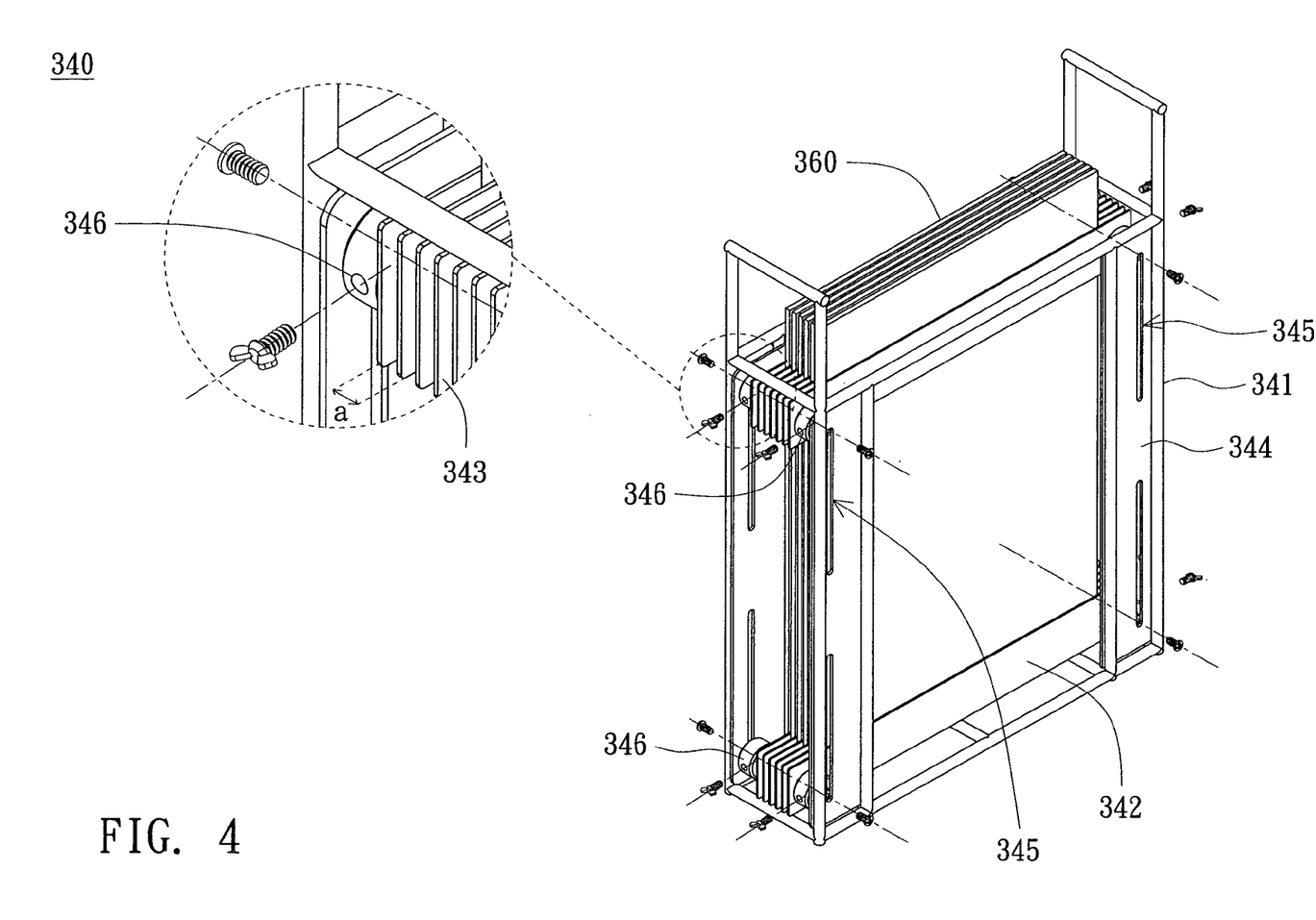
FIG. 4 is a schematic diagram of the carrying unit of FIG. 2B.

Referring to FIGS. 2A~2C and FIG. 3 at the same time, wherein FIG. 3 is a schematic diagram of a thin-film growing method according to the preferred embodiment of the invention. In step 301, provide the substrates 360. The substrates 360 are carried by the carrying unit 340 and separated at a constant range a (as shown in FIG. 4). Referring to FIG. 4, a schematic diagram of the carrying unit 340 of FIG. 2B is shown. The substrates 360 are carried by the carrying unit 340 by a constant range a. The carrying unit 340 includes a frame 341, a number of lower separation plates 342 and upper separation plates 343, a separation positioning plate 344 and a positioning device 346.

The lower separation plates 342 are coupled to the lower end of the frame for fixing the lower ends of the substrates 360 by the constant range a. The upper separation plates 343 are coupled to the upper end of the frame 341 for fixing the upper ends of the substrates 360 by the constant range a. The carrying unit 340 can change the constant range a of the substrates 360 by adjusting the upper separation plates 343 and lower separation plates 342 according to the composition, concentration, temperature, a pH-value of the reaction liquid and surface features of the substrates 360. Besides, the upper separation plates 343 and lower separation plates 342 can be adjusted simultaneously to have the same constant range a to maintain the substrates 360 arranged in parallel.

The separation positioning plate 344 is disposed at one side of the frame 341. The separation positioning plate 344 includes at least a sliding groove 345 and a positioning device 346. The upper separation plates 343 and lower separation plates 342 slide along the sliding groove 345. The positioning device 346 is for adjusting and positioning the positions of the upper separation plates 343 and lower separation plates 342 in the sliding groove 345 such that the relative positions of the upper separation plates 343 and lower separation plates 344 fit in with the size of the substrates 360. Therefore, the carrying unit 340 of the embodiment can be applied to various sizes of substrates 360.

Moreover, the carrying unit 340 can adjust the range a of the substrates 360 through the upper separation plates 343 and lower separation plates 342, wherein the range a is between 0.5 mm and 10 mm. In the embodiment, the carrying unit 340 adjusts the range a of the substrates 360 to be 3 mm. When a thin film is to be grown on a number of substrates 360, the required range of the substrates 360 is related to the composition of the reaction liquid. For this reason, the carrying unit 340 is designed to have function of adjusting the range of the substrates 360, and thus can be applied to various reaction liquid, which can effectively reduce manufacturing cost.

In additions, referring to FIGS. 2A~2C at the same time, the carrying unit 340 is moved by the shifting unit 320 in the thin-film growing apparatus 300. The shifting unit 320 consists of a shift combination frame 321, transverse shift motor 322, a line of gear wheels 323, an elevating motor 324, a screw shaft 325 and a unit connection frame 326. The unit connection frame 326 is coupled to the carrying unit 340 and the shifting unit 320 moves the carrying unit 340 according to a control command.

Next, in step 302 of FIG. 3, the shifting unit 320 moves the carrying unit 340 and placing the carried substrates 360 into the several cleaning troughs 311. The cleaning troughs 311 contain a cleaning liquid for cleaning the substrates 360. The ultrasonic vibrator 313 is disposed at the lower part of the cleaning troughs 311 to increase a cleaning effect of the cleaning liquid. The cleaning procedure of the embodiment is to clean by ethanol, deionized water, acetone and deionized water in sequence. The impurities on the surface of the substrates 360 can be removed by using the ultrasonic vibration to increase a cleaning effect.

Afterward, in step 303 of FIG. 3, adjust the reaction parameters, such as the concentration, the temperature, the pH-value of the reaction liquid. In the embodiment, the reaction liquid is at least consisted of first liquid and second liquid. The first liquid is consisted of monovalance metal ions and trivalence metal ions or consisted of monovalence metal ions, trivalence metal ions and di-valence metal ions. Moreover, the first liquid is consisted of nitric acid, sulfuric acid, acetic acid, phosphoric acid or the halogens and indium (In), sodium (Na), potassium (K), magnesium (Mg), calcium (Ca), strontium (Sr), aluminum (Al), gallium (Ga), antimony (Sb), copper (Cu), silver (Ag), zinc (Zn), iron (Fe), platinum (Pt), titanium (Ti), zirconium (Zr), niobium (Nb), tantalum (Ta), manganese (Mn), ruthenium (Ru), nickel (Ni), cadmium (Cd) or wolfram (W). The second liquid is sulfuric-ion liquid, and consisted of sulfuric ions provided by sulfur acetylate amine ($CH_3CSNH_2$).

In the embodiment, the thin film is exemplified to be a thin film of semiconductor sulfide consisted of silver indium sulfide ($AgIn_5S_8$). The reaction liquid of the embodiment is a mixture of the first liquid and second liquid. The first liquid includes 0.1~1 M of silver ions ($Ag^+$) and indium ions ($In^{3+}$) and 6.4~8.4 M of triathylate amine ($C_6H_{15}NO_3$). The second liquid includes 0.1~1 M of sulfuric ions ($S^{2-}$). The mixture volume ratio of the first liquid and the second liquid is 1:1~1:20, and the pH value of the reaction liquid is 1~3. The temperature of the reaction liquid is controlled to be between 40° C. and 90° C.

Preferably, the first liquid includes 0.4 M of mixture liquid of silver nitrate ($AgNO_3$) and indium nitrate ($In(NO_3)_3$) and 7.4 M of triathylate amine ($C_6H_{15}NO_3$) as a source of positive ions ($Ag^+$, $In^{3+}$) of the reaction liquid. The second liquid includes 0.4 mole of sulfur acetylate amine ($CH_3CSNH_2$) as a source of negative ions ($S^{2-}$). The mixture volume ratio of the first liquid and second liquid is 1:7 and sulfuric acid is used to adjust the pH-value of the reaction liquid to be between 1.5 and 2. In the meanwhile, the temperature of the reaction liquid is controlled to be 80° C.

As shown in FIGS. 2A~2C, the parameter adjusting unit 350 is disposed in the reaction trough 310 and includes a sensor 351 and a constant-temperature equipment 352. The sensor 351 is for adjusting the concentration and the pH-value of the reaction liquid and the constant-temperature equipment 352 is for adjusting and maintaining the temperature of the reaction liquid. When the thin-film growing method is performed, the parameter adjusting unit 350 can effectively control the reaction environment of the reaction liquid to stabilize the parameters for thin film deposition. The chemical reaction formulas of the reaction liquid are shown as below.

$$CH_3CSNH_2+H^+ \rightarrow H_2S+CH_3CNH^+ \quad (1)$$

$$H_2S+H_2O \rightarrow HS^-+H_3O^+ \quad (2)$$

$$HS^-+H_2O \rightarrow S^{2-}+H_3O^+ \quad (3)$$

The whole chemical reaction formula is as follows:

$$Ag^+ + (5-4x)In^{3+} + (8-6x)S^{2-} \rightarrow xAgInS_2/(1-x)AgIn_5S_8, \quad x=0\sim1 \quad (4)$$

Besides, referring to FIGS. 2A and 2B, the liquid input device 370 is in charge of providing the above reaction trough 310 and cleaning trough 311 with the reaction liquid and cleaning liquid. The liquid input device 370 includes a control valve unit 371 of cleaning liquid and reaction liquid, setting bump 372 and the reaction liquid storage tank 373. The control valve unit 371 sends out a control command to control the setting bump to bump the reaction liquid from the storage tank 373 into the assigned reaction trough 310 and bump the cleaning liquid from the cleaning liquid storage tank (not shown in the figure) into the assigned cleaning trough 311. The liquid input device 370 can release liquid of the troughs through a liquid releasing pipe (not shown in the figure) according to the control command.

Then, in step 304 of FIG. 3, when the parameters of the reaction liquid of the reaction trough 310 is adjusted by the parameter adjusting unit 350, the carrying unit 340 is moved by the shifting unit 320 to place the substrates 360 into the reaction trough 310.

Following that, in step 305 of FIG. 3, vibrate the reaction liquid by ultrasonic waves to generate reaction of the liquid and grow a thin film on the substrates 360. The ultrasonic vibrator 312 is disposed at the lower part of the constant-temperature equipment 352 of the reaction trough 310 and the vibration frequency of the ultrasonic waves is 20 kHz~120 kHz. The reaction liquid is vibrated in this vibrating frequency for 30 minutes to grow the thin film on the substrates 360. The ultrasonic waves for vibrating the reaction liquid have the following two functions. One is to mix evenly the reaction liquid. The other is to shake out the cluster-by-cluster particles absorbed by the substrates 360 from the surface of the thin film and help the ion-by-ion particles to grow the thin film to achieve the purpose of selective deposition. In this way, the thin film grown can be thick, firm, even and have high adhesion ability.

Next, in step 306 of FIG. 3, determine whether a number of performing the substrate growing operations reaches a predetermined number. If no, repeat the steps 303 and 305. The predetermined number is 1~10. In the embodiment, the steps 303~305 are repeated four times for growing the substrates 360 to complete the thin film growing method.

Figure 5:
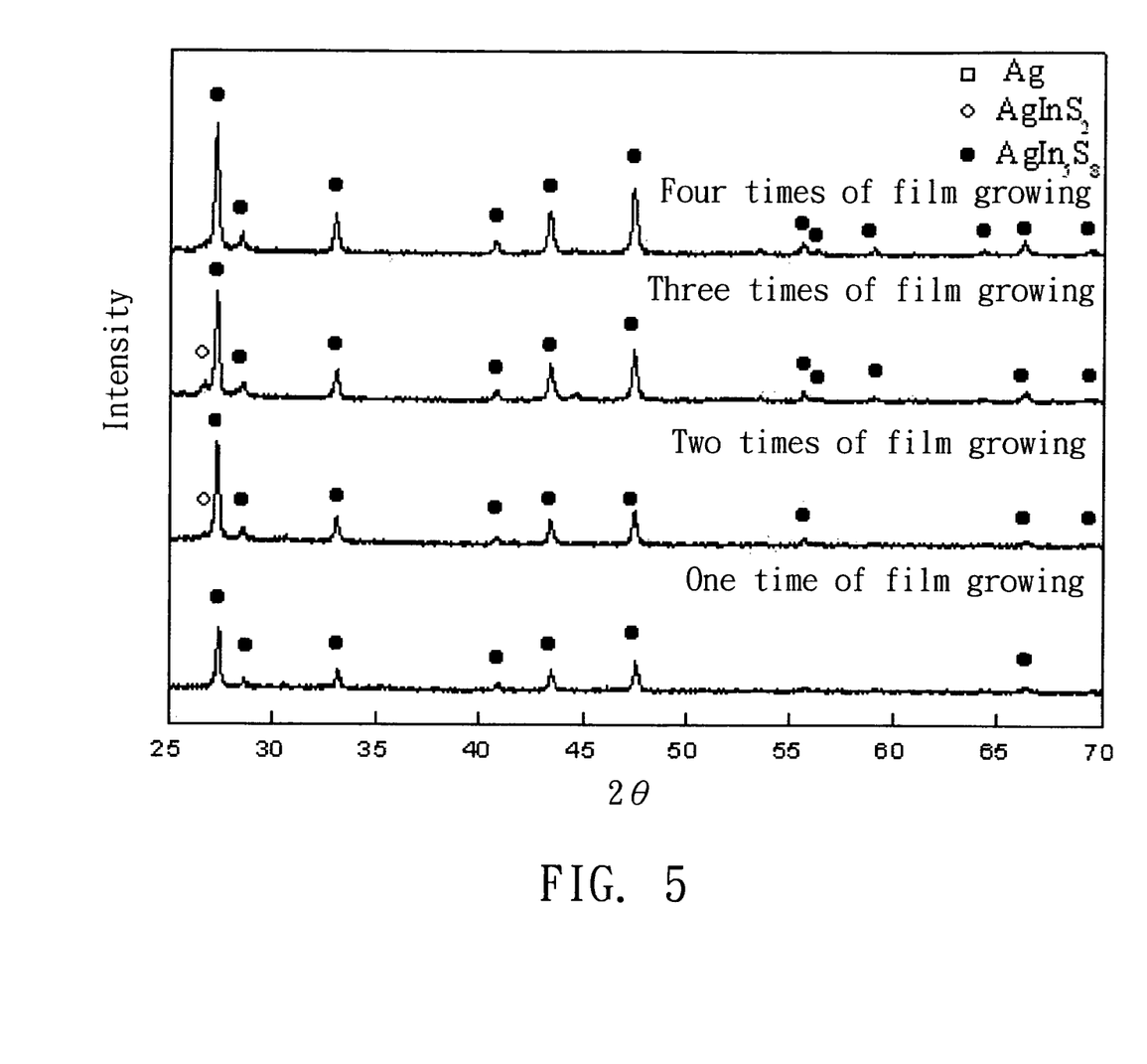
FIG. 5 is a XRD analysis diagram of a semiconductor thin film $AgIn_5S_8$ according to the preferred embodiment of the invention.

Referring to FIG. 5, a XRD analysis diagram of a semiconductor thin film $AgIn_5S_8$ according to the preferred embodiment of the invention is shown. The crystal composition of the thin film $AgIn_5S_8$ is analyzed by a XRD method, The sample of the XRD analysis diagram is a thin film production of the embodiment. The thin film production is a thin film $AgIn_5S_8$ processed by four times of growing. After burning the thin film with 550° C. argon in a pipe-like stove for one hour, the thin film has a structure of stereotyped cubic-type $AgIn_5S_8$ phase, which has an even thickness and high adhesion ability. Therefore, the invention can improve thin-film quality of liquid phase deposition by vibrating the reaction liquid with ultrasonic waves and growing repeatedly.

Besides, a number of reaction troughs can be disposed in series in the thin-film growing apparatus of the invention to perform a number of growing processes according to process requirement in addition to repeating a growing process by using a single reaction trough.

The method and apparatus of growing a thin film disclosed by the above embodiment can not only improve thin-film quality by ultrasonic vibration, but also improve the drawback of the thin film with uneven thickness and poor adhesion ability in the liquid phase deposition method. Moreover, the optimal thickness and quality of the thin film can be obtained by using the carrying unit to adjust the range of the substrates and repeatedly growing. The chemical thin film deposition method is a well-known industrial process and has the advantages of lower production cost and limitation of appearance of deposition carriers. Therefore, the invention can improve the drawback of the conventional chemical deposition method and reduce the production cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for selectively growing a thin film having $AgInS_2/AgIn_5S_8$ solid mixtures or a thin film having $AgIn_5S_8$ structure in continuous process using a same formulation, at least comprising:
    (a) providing a plurality of substrates;
    (b) cleaning the substrates;
    (c) adjusting the temperature, the concentration and the pH-value of a reaction liquid, the reaction liquid is consisted of a first liquid and a second liquid, the first liquid comprises 0.1~1 M of silver ions ($Ag^+$) and indium ions ($In^{3+}$) and 6.4~8.4 M of triathylate amine ($C_6H_{15}NO_3$), the second liquid comprises 0.1~1 M of sulfuric ions ($S^{2-}$), the mixture volume ratio of the first liquid and the second liquid is 1:1~1:20, and the pH value of the reaction liquid is 1~3;
    (d) placing the substrates into the reaction liquid;
    (e) vibrating the reaction liquid by ultrasonic waves such that a thin film is grown on the substrates evenly; and
    (f) determining whether a number of performing the steps (c), (d) and (e) reaches a predetermined number, and if no, repeating the steps (c), (d) and (e), wherein the predetermined number is 1~3 when growing the thin film having $AgInS_2/AgIn_5S_8$ solid mixtures, and the predetermined number is 4~10 when growing the thin film having $AgIn_5S_8$ structure.

2. The method according to claim 1, wherein the step (a) comprises:

carrying the substrates at a constant distance of separation between each other by using a carrying unit.

3. The method according to claim 2, wherein the constant distance is between 0.5 mm and 10 mm.

4. The method according to claim 1, wherein in the step (e), the ultrasonic waves have a vibrating frequency between 20 kHz and 120 kHz.

5. The method according to claim 1, wherein the temperature of the reaction liquid is controlled to be between 40° C. and 90° C.

* * * * *